(12) United States Patent
Lee

(10) Patent No.: US 9,093,396 B2
(45) Date of Patent: Jul. 28, 2015

(54) SILICON INTERPOSER SYSTEMS

(71) Applicant: Masahiro Lee, Tokai (JP)

(72) Inventor: Masahiro Lee, Tokai (JP)

( * ) Notice: Subject to any disclaimer, the term of this patent is extended or adjusted under 35 U.S.C. 154(b) by 519 days.

(21) Appl. No.: 13/653,412

(22) Filed: Oct. 17, 2012

(65) Prior Publication Data

US 2013/0107479 A1 May 2, 2013

Related U.S. Application Data

(60) Provisional application No. 61/533,869, filed on Oct. 31, 2011, provisional application No. 61/599,285, filed on Feb. 15, 2012.

(51) Int. Cl.
*H05K 7/00* (2006.01)
*H01L 23/32* (2006.01)
*H05K 1/02* (2006.01)
*H05K 1/14* (2006.01)
*H05K 3/34* (2006.01)
*H01L 23/00* (2006.01)
*H01L 23/14* (2006.01)
*H01L 23/498* (2006.01)

(52) U.S. Cl.
CPC ............ *H01L 23/32* (2013.01); *H01L 23/147* (2013.01); *H01L 23/49816* (2013.01); *H01L 23/49827* (2013.01); *H01L 24/81* (2013.01); *H01L 24/83* (2013.01); *H01L 2224/133* (2013.01); *H01L 2224/13009* (2013.01); *H01L 2224/1329* (2013.01); *H01L 2224/16237* (2013.01); *H01L 2224/293* (2013.01); *H01L 2224/2929* (2013.01); *H01L 2224/81903* (2013.01); *H01L 2224/83201* (2013.01); *H01L 2224/83851* (2013.01); *H01L 2224/83862* (2013.01); *H01L 2224/9211* (2013.01); *H05K 1/0295* (2013.01); *H05K 1/141* (2013.01); *H05K 3/3436* (2013.01); *H05K 2201/049* (2013.01); *H05K 2201/09954* (2013.01); *Y10T 29/49144* (2015.01)

(58) Field of Classification Search
CPC ................ H05K 1/0295; H05K 1/141; H05K 2201/049; H05K 2201/09954; H05K 3/3436; Y10T 29/49144
USPC .......... 361/760, 784, 803, 771, 780; 438/817, 438/14, 15, 18; 257/E21.526, E23.067, 79, 257/171
See application file for complete search history.

(56) References Cited

U.S. PATENT DOCUMENTS

| | | | |
|---|---|---|---|
| 7,098,528 B2 | 8/2006 | Vasishta et al. | |
| 7,209,366 B2* | 4/2007 | Prokofiev et al. | 361/803 |
| 7,474,540 B1* | 1/2009 | Dang et al. | 361/803 |
| 2005/0046002 A1* | 3/2005 | Lee et al. | 257/678 |
| 2005/0133935 A1 | 6/2005 | Vasishta et al. | |
| 2005/0237073 A1* | 10/2005 | Miller et al. | 324/754 |
| 2006/0033516 A1 | 2/2006 | Rincon et al. | |
| 2008/0143379 A1 | 6/2008 | Norman | |

* cited by examiner

*Primary Examiner* — Yuriy Semeneko
(74) *Attorney, Agent, or Firm* — Lodestar Patents, PLLC; Raymond J. E. Hall

(57) ABSTRACT

A universal silicon interposer system and method to enabling the selective use of multiple proprietary microelectronic devices without the need to substantially alter the end-use application(s). The system may be used in the implementation of three-dimensional (stacked) microelectronics having proprietary contact pin patterns.

21 Claims, 2 Drawing Sheets

SILICON INTERPOSER SYSTEMS

CROSS-REFERENCE TO RELATED APPLICATION

The present application is related to and claims priority from prior provisional application Ser. No. 61/599,285, filed Feb. 15, 2012, entitled "SILICON INTERPOSER SYSTEMS"; and, this application is related to and claims priority from prior provisional application Ser. No. 61/553,869, filed Oct. 31, 2011, entitled "SILICON INTERPOSER SYSTEMS"; the contents of all of which are incorporated herein by this reference and are not admitted to be prior art with respect to the present invention by the mention in this cross-reference section.

BACKGROUND

This invention relates to providing an improved silicon interposer system. More particularly, this invention relates to methods and apparatus arrangements providing a means for implementing a universal silicon interposer enabling the selective use of multiple proprietary microelectronic devices without requiring a redesign of the end-use substrate format.

Implementation of three dimensional (3D) chip stacking using, among other techniques, Through Silicon Vias (TSVs) has allowed microelectronics manufacturers to increase device bandwidth, reduce power consumption, and shrink the physical form factor of the resultant microelectronic devices. Briefly stated, a TSV connection is a galvanic connection between the two sides of a silicon wafer, which is electrically isolated from the substrate and from other TSV connections.

One problem encountered within emerging microelectronic technologies is the initial lack of device format standards. For example, two independent manufacturers may produce equivalent 3D-IC devices having differing (non-compatible) TSV contact pin patterns, thus requiring the end-use application to adopt a manufacturer-specific connection format. A means for enabling the selective use of multiple proprietary microelectronic devices, without the need to substantially alter the end-use application, would benefit the industry and ultimately consumers through lower product development costs, lower production costs, and reduced production risks associated with dependence on single-source suppliers.

OBJECTS AND FEATURES OF THE INVENTION

A primary object and feature of the present invention is to provide a system overcoming the above-mentioned problem(s). Another object and feature of the present invention is to provide a system, including methods and apparatus arrangements, for implementing a universal silicon interposer enabling the selective use of multiple proprietary microelectronic devices, without the need to substantially alter the end-use application. An additional object and feature of the present invention is to provide a system implementing a low-temperature contact-interconnection process to permit later-stage fabrication steps utilizing wafer bumping or other solder connections by avoiding premature solder reflow or similar thermal damage. Other objects and features of this invention will become apparent with reference to the following descriptions.

SUMMARY OF THE INVENTION

In accordance with a preferred embodiment hereof, this invention provides a microelectronic interface system relating to interfacing a set of proprietary microelectronic devices to at least one electrical contact pattern of at least one electronic substrate, wherein each proprietary microelectronic device of such set comprises a proprietary electrical contact pattern distinct from the other members of such set, such system comprising: at least one microelectronic interfacer structured and arranged to electrically interface such set of proprietary microelectronic devices to such at least one electrical contact pattern of such at least one electronic substrate; wherein such at least one microelectronic interfacer comprises at least one first-format-compatible contact configured to implement, within such at least one microelectronic interfacer, at least one first format-compatible electrical contact configured to assist electrical coupling with at least one first proprietary microelectronic device of such set, at least one second-format-compatible contact configured to implement, within such at least one microelectronic interface, at least one second-format-compatible electrical contact configured to assist electrical coupling with at least one second proprietary microelectronic device of such set, at least one third-format-compatible contact configured to implement, within such at least one microelectronic interface, at least one third-format-compatible electrical contact configured to assist electrical coupling with such at least one electrical contact pattern of such at least one electronic substrate, and at least one redistributing coupler configured to redistribute coupling of such at least one first formatted contact and such at least one second formatted contact with such at least one third formatted contact; wherein such at least one third-format-compatible contact comprises at least one solder-based electrical coupler structured and arranged to assist at least one solder-based electrical-coupling of such at least one third-format-compatible contact to at least one electrical contact of such at least one electronic substrate; wherein such at least one solder-based electrical coupler comprises at least one solder having at least one minimum flow temp; and wherein such at least one first-format-compatible contact and such at least one second-format-compatible contact comprises at least one non-solder electrical coupler structured and arranged to assist low-temperature electrical coupling of at least one of such set of proprietary microelectronic devices to at least one of such at least one first-format-compatible contact and such at least one second-format-compatible contact; and wherein such at least one low-temperature electrical coupling assisted by such at least one non-solder electrical coupler occurs at a temperature below such at least one minimum flow temp of such at least one solder.

Moreover, it provides such a microelectronic interface system further comprising at least one electrical isolator structured and arranged to isolate such at least one microelectronic interfacer from at last one of such at least one first proprietary microelectronic device and such at least one second proprietary microelectronic device when at least a selected one of such at least one first proprietary microelectronic device and such at least one second proprietary microelectronic device is electrically coupled to such at least one microelectronic interfacer. Additionally, it provides such a microelectronic interface system further comprising at least one die-attach film structured and arranged to assist coupling of at least a selected one of such at least one first proprietary microelectronic device and such at least one second proprietary microelectronic device to such at least one microelectronic interface.

Also, it provides such a microelectronic interface system further comprising at least one anisotropic conductive film structured and arranged to assist coupling of at least a selected one of such at least one first proprietary microelectronic device and such at least one second proprietary microelectronic device to such at least one microelectronic interface. In addition, it provides such a microelectronic interface system further comprising at least one conductive polymer paste structured and arranged to assist coupling of at least a selected one of such at least one first proprietary microelectronic device and such at least one second proprietary microelectronic device to such at least one microelectronic interface. And, it provides such a microelectronic interface system wherein such at least one conductive polymer paste comprises essentially at least one photo-sensitive-curable material. Further, it provides such a microelectronic interface system such wherein such at least one third format-compatible contact further comprises at least one bump-solder connector, comprising such at least one solder, configured to assist bump-solder electrical coupling of such at least one third format-compatible contact to of such at least one electrical contact of such at least one electronic substrate.

In accordance with another preferred embodiment hereof, this invention provides a method relating to interfacing a set of proprietary microelectronic devices to at least one electrical contact pattern of at least one electronic substrate, wherein each proprietary microelectronic device of such set comprises a proprietary electrical contact pattern distinct from the other members of such set, such system comprising the steps of: providing at least one microelectronic interfacer structured and arranged to electrically interface such set of proprietary microelectronic devices to such at least one electrical contact pattern of such at least one electronic substrate; providing within such at least one microelectronic interfacer at least one first-format-compatible contact configured to implement, within such at least one microelectronic interfacer, at least one first format-compatible electrical contact configured to assist electrical coupling with at least one first proprietary microelectronic device of such set, at least one second-format-compatible contact configured to implement, within such at least one microelectronic interface, at least one second-format-compatible electrical contact configured to assist electrical coupling with at least one second proprietary microelectronic device of such set, at least one third-format-compatible contact configured to implement, within such at least one microelectronic interface, at least one third-format-compatible electrical contact configured to assist electrical coupling with such at least one electrical contact pattern of such at least one electronic substrate, at least one redistributing coupler configured to redistribute coupling of such at least one first formatted contact and such at least one second formatted contact with such at least one third formatted contact, and solder-based electrical coupler means for assisting at least one solder-based electrical-coupling of such third-format-compatible contact means to at least one electrical contact of such at least one electronic substrate, wherein such solder-based electrical coupler means comprises at least one solder having at least one minimum flow temp; configuring such first-format-compatible contact means and such second-format-compatible contact means to comprise non-solder electrical coupler means for assisting low-temperature electrical coupling of at least one of such set of proprietary microelectronic devices to at least one of such first-format-compatible contact means and such second-format-compatible contact means, wherein such low-temperature electrical coupling assisted by such non-solder electrical coupler means occurs at a temperature below such at least one minimum flow temp of such at least one solder.

Even further, it provides such a method further comprising the step of providing within such at least one microelectronic interface, at least one electrical isolator structured and arranged to electrically isolate portions of such at least one microelectronic interfacer from at last one of such at least one first proprietary microelectronic device and such at least one second proprietary microelectronic device when at least a selected one of such at least one first proprietary microelectronic device and such at least one second proprietary microelectronic device is electrically coupled to such at least one microelectronic interfacer. Moreover, it provides such a method further comprising the step of forming within such at least one third format-compatible contact at least one bump-solder connector, using such at least one solder, configured to assist bump-solder electrical coupling of such at least one third format-compatible contact to of such at least one electrical contact of such at least one electronic substrate.

Additionally, it provides such a method further comprising the step of coupling at least a selected one of such at least one first proprietary microelectronic device and such at least one second proprietary microelectronic device to such at least one microelectronic interface using at least one die-attach film. Also, it provides such a method further comprising the step of coupling at least a selected one of such at least one first proprietary microelectronic device and such at least one second proprietary microelectronic device to such at least one microelectronic interface using at least one anisotropic conductive film. In addition, it provides such a method further comprising the step of coupling at least a selected one of such at least one first proprietary microelectronic device and such at least one second proprietary microelectronic device to such at least one microelectronic interface using at least one conductive polymer paste. And, it provides such a method wherein such at least one conductive polymer paste comprises essentially at least one photo-sensitive-curable material.

In accordance with another preferred embodiment hereof, this invention provides a microelectronic interface system relating to interfacing a set of proprietary microelectronic devices to at least one electrical contact pattern of at least one electronic substrate, wherein each proprietary microelectronic device of such set comprises a proprietary electrical contact pattern distinct from the other members of such set, such system comprising: microelectronic interfacer means for electrically interfacing such set of proprietary microelectronic devices to such at least one electrical contact pattern of such at least one electronic substrate; wherein such microelectronic interfacer means comprises first-format-compatible contact means for implementing, within such microelectronic interfacer means, at least one first-format-compatible electrical contact configured to assist electrical coupling with at least one first proprietary microelectronic device of such set, second-format-compatible contact means for implementing within such microelectronic interfacer means at least one second-format-compatible electrical contact configured to assist electrical coupling with at least one second proprietary microelectronic device of such set, third-format-compatible contact means for implementing within such microelectronic interfacer means at least one third-format-compatible electrical contact configured to assist electrical coupling with such at least one electrical contact pattern of such at least one electronic substrate, and redistributing coupler means for redistributed coupling of such first-format-compatible contact means and such second formatted contact means with such third-format-compatible contact means; wherein such third-format-compatible contact means comprises solder-based electrical coupler means for assisting at least one solder-based electrical-coupling of such third-format-compatible contact means to at least one electrical contact of such at least one electronic substrate; wherein such solder-based electrical coupler means comprises at least one solder having at least one minimum flow temp; and wherein such first-format-compatible contact means and such second-format-compatible contact means comprises non-solder electrical coupler means for assisting low-temperature electrical coupling of at least one of such set of proprietary microelectronic devices to at least one of such first-format-compatible contact means and such second-format-compatible contact means; and wherein such low-temperature electrical coupling assisted by such non-solder electrical coupler means occurs at a temperature below such at least one minimum flow temp of such at least one solder.

Further, it provides such a microelectronic interface system further comprising electrical isolator means for electrically isolating portions of such microelectronic interfacer means from at last one of such at least one first proprietary microelectronic device and such at least one second proprietary microelectronic device when at least a selected one of such at least one first proprietary microelectronic device and such at least one second proprietary microelectronic device is electrically coupled to such microelectronic interfacer means. Even further, it provides such a microelectronic interface system further comprising at least one die-attach film structured and arranged to assist coupling of at least a selected one of such at least one first proprietary microelectronic device and such at least one second proprietary microelectronic device to such at least one microelectronic interface. Even further, it provides such a microelectronic interface system further comprising at least one anisotropic conductive film structured and arranged to assist coupling of at least a selected one of such at least one first proprietary microelectronic device and such at least one second proprietary microelectronic device to such at least one microelectronic interface. Even further, it provides such a microelectronic interface system further comprising at least one conductive polymer paste structured and arranged to assist coupling of at least a selected one of such at least one first proprietary microelectronic device and such at least one second proprietary microelectronic device to such at least one microelectronic interface.

Even further, it provides such a microelectronic interface system wherein such at least one conductive polymer paste comprises essentially at least one photo-sensitive-curable material. Even further, it provides such a microelectronic interface system such wherein such third format-compatible contact means further comprises bump-solder connector means for assisting bump-solder electrical coupling of such third format-compatible contact means to such electrical contact means of such at least one electronic substrate. In accordance with preferred embodiments hereof, this invention provides each and every novel feature, element, combination, step and/or method disclosed or suggested by this patent application.

DETAILED DESCRIPTION OF THE BEST MODES AND PREFERRED EMBODIMENTS OF THE INVENTION

Figure 1:
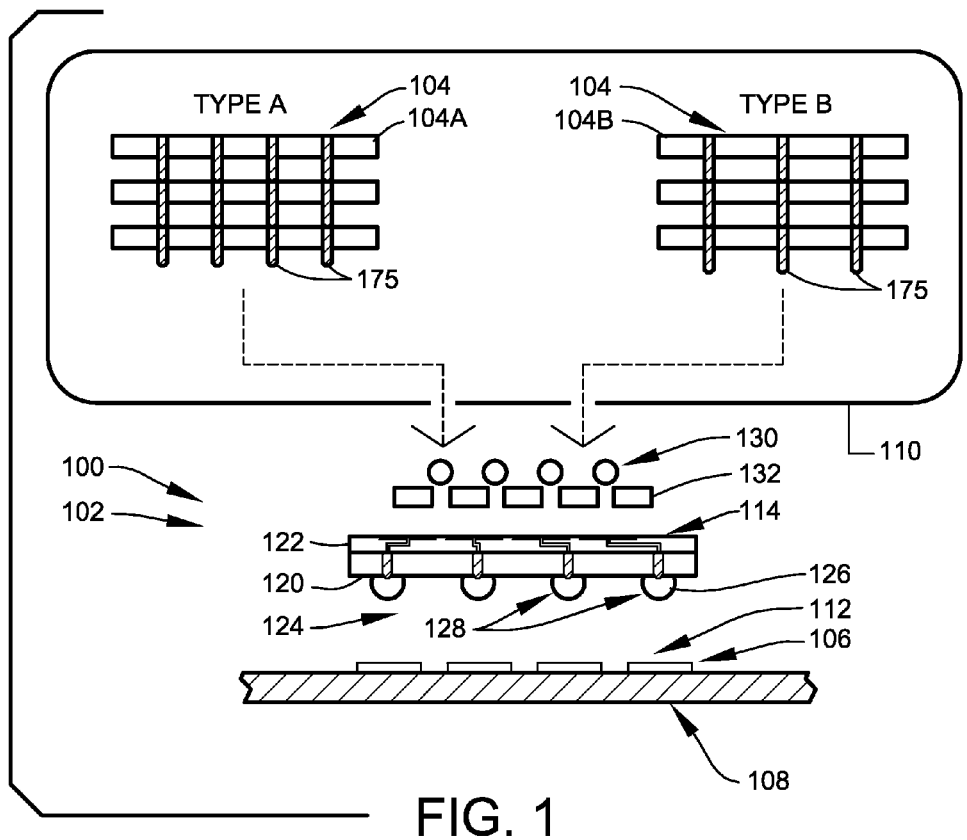
FIG. 1 shows a schematic diagram, illustrating a universal silicon interposer enabling the selective use of multiple proprietary microelectronic devices, without requiring a redesign of the end-use substrate format, according to a preferred embodiment of the present invention.

FIG. 1 shows a diagram, schematically illustrating universal silicon interposer 102 of silicon interposer system 100, according to a preferred embodiment of the present invention. Preferred embodiments of silicon interposer system 100, preferably including universal silicon interposer 102, preferably enable the selective use of multiple proprietary microelectronic devices 104, without requiring the redesign or reformatting of the electrical contact interface 106 of the end-use electronic substrate 108.

FIG. 1 generally illustrates proprietary microelectronic devices 104 produced by two independent manufacturers. For the purpose of the present disclosure, the first proprietary microelectronic device will be identified herein as proprietary microelectronic device 104A and the second as proprietary microelectronic device 104B. Although the two microelectronic devices depicted in FIG. 1 are imagined to comprise essentially equivalent functionality, each hypothetical manufacturer has produced a proprietary microelectronic device having differing (non-compatible) electrical-contact pin pattern, as shown. Absent of Applicant's system embodiments, the end-use electronic substrate 108 would require modification to support a single one of the manufacturer-specific connection formats.

Universal silicon interposer 102 preferably provides a means for enabling the selective use of either one of the first microelectronic device 104A or second proprietary microelectronic device 104B without the need to alter the end-use substrate 108 of the end-use application (that is, to accommodate one or the other of the manufacturer-specific connection formats). As noted above, universal silicon interposer 102 preferably enables the selective use of multiple proprietary microelectronic devices 104, without requiring the redesign or reformatting of the electrical contact interface 106 of the end-use electronic substrate 108. This preferred feature assists in lowering product development costs, production costs, and may reduced production risks associated with the dependence on a single-source supplier.

Universal silicon interposer 102 preferably provides a customized "last" redistribution layer to meet different types of proprietary microelectronic devices 104 utilizing, for example, diverse range of TSV packaging. Universal silicon interposer 102 is preferably configured to enable implementation of a uniform process just before the last redistribution layer process.

Each universal silicon interposer 102 is preferably configured to electrically interface the members of set 110 to the electrical contact pattern 112 of electronic substrate 108. In other words, each universal silicon interposer 102 functions as a microelectronic interfacer 114 adapting two or more different types of proprietary microelectronic devices 104 to the electrical contact pattern 112 of electronic substrate 108 (at least embodying herein microelectronic interfacer means for electrically interfacing such set of proprietary microelectronic devices to such at least one electrical contact pattern of such at least one electronic substrate).

Each universal silicon interposer 102 is preferably organized to comprise at least one first-format-compatible contact layer 116, at least one second-format-compatible contact layer 118, at least one third-format-compatible contact layer 120, and at least one electrical-interconnection layer identified herein as redistributing coupler 122.

First-format-compatible contact layer 116 is preferably configured to implement, within universal silicon interposer 102, at least one first set of format-compatible electrical contacts that preferably function to assist electrical coupling universal silicon interposer 102 with at least the first microelectronic device 104A of set 110 (at least embodying herein first-format-compatible contact means for implementing, within such microelectronic interfacer means, at least one first-format-compatible electrical contact configured to assist electrical coupling with at least one first proprietary microelectronic device of such set). Second-format-compatible contact layer 118 is preferably configured to implement, within universal silicon interposer 102, at least one second set of format-compatible electrical contacts configured to assist electrical coupling universal silicon interposer 102 with at least the second proprietary microelectronic device 104B of set 110 (at least embodying herein second-format-compatible contact means for implementing within such microelectronic interfacer means at least one second-format-compatible electrical contact configured to assist electrical coupling with at least one second proprietary microelectronic device of such set). It is noted that, in preferred embodiments of the present system, first-format-compatible contact layer 116 and second-format-compatible contact layer 118 may share common electrical contacts. This preferably occurs when the packaging formats of the members of set 110 are relatively similar in physical form.

Third-format-compatible contact layer 120 is preferably configured to implement, within universal silicon interposer 102, at least one third set of format-compatible electrical contacts, which are preferably configured to assist the electrical coupling of universal silicon interposer 102 to the pre-established electrical contact pattern 112 of the end-use electronic substrate 108 (at least embodying herein third-format-compatible contact means for implementing within such microelectronic interfacer means at least one third-format-compatible electrical contact configured to assist electrical coupling with such at least one electrical contact pattern of such at least one electronic substrate).

Redistributing coupler 122 is preferably configured to appropriately redistribute the electrical conduction paths between first formatted contact layer 116, second formatted contact layer 118, and third formatted contact layer 120 (at least embodying herein redistributing coupler means for redistributed coupling of such first-format-compatible contact means and such second formatted contact means with such third-format-compatible contact means).

In one preferred embodiment of the present system, the third format-compatible contact layer 120 preferably utilizes at least one solder-based electrical coupler 124 to assist coupling of universal silicon interposer 102 to the electrical contacts of electronic substrate 108. In such a preferred soldering process, the metallic contacts of the third format-compatible contact layer 120 are electrically and mechanically bonded to electronic substrate 108 by melting and flowing a metallic solder 126 onto the two contact structures. In a preferred soldering process employed by the present system, heat is applied to the parts to be joined, causing solder 126 to melt and to bond to the components.

Preferably, solder 126 comprises a metallic composition having a minimum melting (flow temperature) that is lower than the melting temperature of the metallic contacts to be joined.

Preferably, third format-compatible contact layer 120 is configured to comprise at least one bump-solder connector 128, as shown. Bump-solder connector 128 preferably comprises a set of solder bumps comprising small spheres of solder 126 (solder balls) that are preferably bonded to contact areas or pads of third-format-compatible contact layer 120. Preferably, bump-solder connector 128 is configured to assist such bump-solder electrical coupling of third format-compatible contact layer 120 to the electrical contacts of electronic substrate 108.

Preferably, universal silicon interposer 102 further implements a low-temperature contact-interconnection process to operably join a selected proprietary microelectronic device 104 to universal silicon interposer 102 prior to mounting the combined assembly to the end-use substrate 108. This preferred arrangement allows flexibility in fabrication processes in that a proprietary microelectronic device 104 can be operably joined with universal silicon interposer 102, prior to mounting the combined assembly to the end-use substrate 108, thus permitting later-stage fabrication steps utilizing wafer bumping or other solder-based connections. The preferred use of such low-temperature contact-interconnection process eliminates premature solder reflow or similar thermal damage.

Preferably, first-format-compatible contact layer 116 and second-format-compatible contact layer are configured to utilize at least one non-solder electrical coupler 130 to assist such low-temperature electrical coupling of a selected proprietary microelectronic device 104 to first-format-compatible contact layer 116 and/or second-format-compatible contact layer 118. Such low-temperature electrical coupling is preferably assisted by selecting a non-solder electrical coupler 130 having a curing temperature (i.e., an overall processing temperature) below the minimum flow temperature of solder 126. This preferred arrangement allows flexibility in fabrication processes utilizing universal silicon interposer 102 in that a solder-based connector can be applied to third format-compatible contact layer 120 prior to the joining of a proprietary microelectronic device 104 to universal silicon interposer 102. Furthermore, the system permits, under appropriate circumstances, the damage-free joining of a proprietary microelectronic device 104 to universal silicon interposer 102 after an unpopulated universal silicon interposer 102 has been mounted to end-use substrate 108 by soldering.

In most preferred embodiments of the present system, at least one electrical isolator 132 is preferably established between proprietary microelectronic device 104 and first-format-compatible contact layer 116/second-format-compatible contact layer 118 of universal silicon interposer 102, as shown. Electrical isolator 132 preferably functions to electrically isolate TSV connections 175 from the substrate and from other TSV connections. In fundamental terms, this preferred electrical isolation layer functions to isolate microelectronic interfacer 114 from the selected proprietary microelectronic device 104 (that is, first proprietary microelectronic device 116 and/or second proprietary microelectronic device 118) when the device is electrically coupled to microelectronic interface 114. It is noted that electrical isolator 132 can also preferably function to mechanically stabilize the mounted proprietary microelectronic device 104 adjacent universal silicon interposer 102. Electrical isolators 132 suitable for use with the present system include non-conductive polymer pastes, non-conductive die-attach adhesives/films, un-filled epoxy adhesives, non-conductive polymer-based adhesives, epoxy-based dry film photoresists, etc. Preferred epoxy-based dry film photoresists include products distributed by Tokyo Ohka Kogyo Co., Ltd. (TOK) under the TMMF trade name.

Non-solder electrical couplers 130 suitable for use with the present system include conductive adhesives (glues) having cure temperatures lower than the minimum flow temperature of solder 126. These conductive adhesives may preferably comprise a range of commercially-available products, such as, for example, conductive polymer pastes, die-attach conductive adhesives/films, metallic-filled epoxy adhesives, polymer-based electrically conductive adhesives, etc. Preferred conductive polymer pastes include low-temperature photo-sensitive-curable materials.

In one alternate preferred embodiment of the present system, non-solder electrical couplers 130 comprise at least one anisotropic conductive film. Anisotropic Conductive Film (ACF) consists of conducting particles suspended in an adhesive polymer resin. ACF allows electrical interconnection through the adhesive thickness (the Z-axis), but are electrically insulating along the plane of the adhesive (due to the conducting particles being spaced far enough apart within the matrix). Thus, the ACF material is preferably capable of functioning simultaneously as both non-solder electrical couplers 130 and electrical isolator 132. The preferred ACF bonding process is a compression bonding process. Final bonding is preferably established by low-temperature thermal cure of the ACF resin and conductive particle deformation between the TSV connections of the proprietary microelectronic devices 104 and contacts of first-format-compatible contact layer 116.

Figure 2:
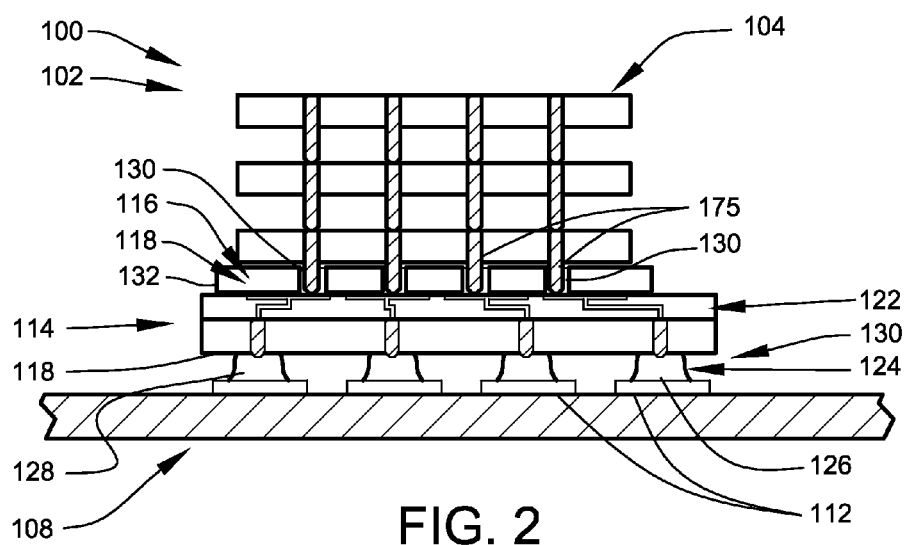
FIG. 2 shows a schematic diagram, illustrating a proprietary microelectronic device chip adapted to an end-use substrate using the universal silicon interposer according to the preferred embodiment of FIG. 1.

FIG. 2 shows a schematic diagram, illustrating a proprietary microelectronic device 104 (in the present preferred example, a TSV stacked package) adapted to an end-use substrate 108 using universal silicon interposer 102, according to the preferred embodiment of FIG. 1. In the assembled arrangement of FIG. 2, the proprietary microelectronic device 104 has been mechanically and electrically coupled to first-format-compatible contact layer 116 using non-solder electrical coupler 130. An electrical isolation layer, comprising electrical isolator 132, has been implemented to separate proprietary microelectronic device 104 from first-format-compatible contact layer 116/second-format-compatible contact layer 118, as shown.

Third-format-compatible contact layer 120 of the combined assembly has been electrically coupled to end-use substrate 108 using solder-based electrical coupler 124, which preferably comprises bump-solder connector 128, as shown.

It is further noted that universal silicon interposer 102 enhances end-use reliability by attenuating (buffering) mechanical and thermal "shock" forces developed between the proprietary microelectronic device 104 and printed-circuit materials of electronic substrate 108. Preferably, universal silicon interposer 102 functions as a thermal-expansion buffer, to accommodate differences in thermal expansion ratios (that is, differences in the thermal expansion coefficient and the temperature coefficient of Young's modulus) between components.

Figure 3:
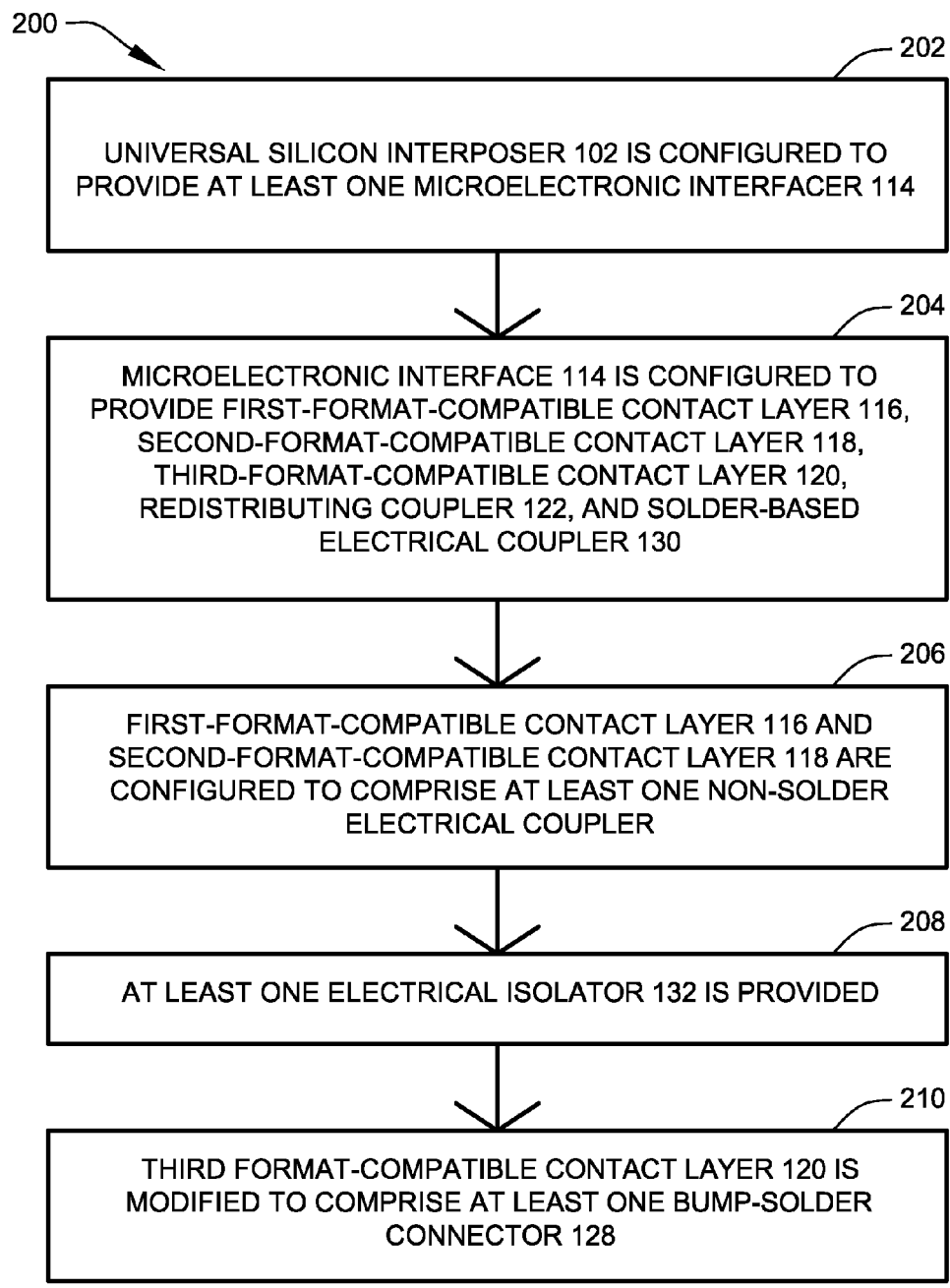
FIG. 3 shows a flow diagram, illustrating the steps enabling a preferred method of the present invention.

FIG. 3 shows a flow diagram, illustrating the steps enabling preferred method 200 of the present invention. Method 200 preferably relates to interfacing proprietary microelectronic devices 104 of set 110 to at least one electrical contact pattern 112 of at least one electronic substrate 108, wherein each proprietary microelectronic device 104 of set 110 preferably comprises a proprietary electrical contact pattern distinct from the other members of set 110. In the initial preferred step 202 of method 200, universal silicon interposer 102 is structured and arranged to provide at least one microelectronic interfacer 114. As noted previously, microelectronic interfacer 114 functions to electrically interface such proprietary microelectronic devices 104 to the electrical contact pattern 112 electronic substrate 108. Next, as indicated in preferred step 204, microelectronic interface 114 is structured and arranged to provide first-format-compatible contact layer 116, at least one second-format-compatible contact layer 118, third-format-compatible contact layer 120, redistributing coupler 122, and solder-based electrical coupler 124 to assist solder-based electrical-coupling of third-format-compatible contact layer 120 to at least one electrical contact of electronic substrate 108. Next, first-format-compatible contact layer 116 and second-format-compatible contact layer 118 are configured to comprise at least one non-solder electrical coupler to assist low-temperature electrical coupling of the proprietary microelectronic devices 104 to at least one of first-format-compatible contact layer 116 and second-format-compatible contact layer 118, as indicated in preferred step 206. It is again noted that such low-temperature electrical coupling occurs at a temperature below the minimum flow temp of solder 126.

Next, as indicated in preferred step 208, at least one electrical isolator 132 is provided to isolate portions of the selected proprietary microelectronic devices 104 from microelectronic interface 114. Next, third format-compatible contact layer 120 is modified to comprise at least one bump-solder connector 128, as indicated in preferred step 210. In preferred step 212, at least a selected one of the first proprietary microelectronic device 104A and second proprietary microelectronic device 104B are coupled to microelectronic interface 114 of universal silicon interposer 102 using at least one non-solder electrical coupler 130. Such non-solder electrical couplers 130 at least preferably comprise die-attach films, alternately preferably anisotropic conductive films, conductive alternately preferably polymer pastes (including photo-sensitive-curable materials).

Although Applicant has described Applicant's preferred embodiments of this invention, it will be understood that the broadest scope of this invention includes modifications such as diverse shapes, sizes, and materials. Such scope is limited only by the below claims as read in connection with the above specification. Further, many other advantages of Applicant's invention will be apparent to those skilled in the art from the above descriptions and the below claims.

What is claimed is:

1. A microelectronic interface system relating to interfacing a set of proprietary microelectronic devices to at least one electrical contact pattern of at least one electronic substrate, wherein each proprietary microelectronic device of such set comprises a proprietary electrical contact pattern distinct from the other members of such set, said system comprising:
   a) at least one microelectronic interfacer structured and arranged to electrically interface such set of proprietary microelectronic devices to such at least one electrical contact pattern of such at least one electronic substrate;
   b) wherein said at least one microelectronic interfacer comprises
      i) at least one first-format-compatible contact configured to implement, within said at least one microelectronic interfacer, at least one first format-compatible electrical contact configured to assist electrical coupling with at least one first proprietary microelectronic device of such set,
      ii) at least one second-format-compatible contact configured to implement, within said at least one microelectronic interface, at least one second-format-compatible electrical contact configured to assist electrical coupling with at least one second proprietary microelectronic device of such set, iii) at least one third-format-compatible contact configured to implement, within said at least one microelectronic interface, at least one third-format-compatible electrical contact configured to assist electrical coupling with such at least one electrical contact pattern of such at least one electronic substrate, and iv) at least one redistributing coupler configured to redistribute coupling of said at least one first formatted contact and said at least one second formatted contact with said at least one third formatted contact;

c) wherein said at least one third-format-compatible contact comprises at least one solder-based electrical coupler structured and arranged to assist at least one solder-based electrical-coupling of said at least one third-format-compatible contact to at least one electrical contact of such at least one electronic substrate;

d) wherein said at least one solder-based electrical coupler comprises at least one solder having at least one minimum flow temp;

e) wherein said at least one first-format-compatible contact and said at least one second-format-compatible contact comprises at least one non-solder electrical coupler structured and arranged to assist low-temperature electrical coupling of at least one of such set of proprietary microelectronic devices to at least one of said at least one first-format-compatible contact and said at least one second-format-compatible contact; and f) wherein such at least one low-temperature electrical coupling assisted by said at least one non-solder electrical coupler occurs at a temperature below such at least one minimum flow temp of said at least one solder.

2. The microelectronic interface system, according to claim 1, further comprising at least one electrical isolator structured and arranged to isolate said at least one microelectronic interfacer from at least one of such at least one first proprietary microelectronic device and such at least one second proprietary microelectronic device when at least a selected one of such at least one first proprietary microelectronic device and such at least one second proprietary microelectronic device is electrically coupled to said at least one microelectronic interfacer.

3. The microelectronic interface system, according to claim 2, further comprising at least one die-attach film structured and arranged to assist coupling of at least a selected one of such at least one first proprietary microelectronic device and such at least one second proprietary microelectronic device to such at least one microelectronic interface.

4. The microelectronic interface system, according to claim 2, further comprising at least one anisotropic conductive film structured and arranged to assist coupling of at least a selected one of such at least one first proprietary microelectronic device and such at least one second proprietary microelectronic device to such at least one microelectronic interface.

5. The microelectronic interface system, according to claim 2, further comprising at least one conductive polymer paste structured and arranged to assist coupling of at least a selected one of such at least one first proprietary microelectronic device and such at least one second proprietary microelectronic device to such at least one microelectronic interface.

6. The microelectronic interface system, according to claim 5, wherein said at least one conductive polymer paste comprises essentially at least one photo-sensitive-curable material.

7. The microelectronic interface system, according to claim 1, wherein said at least one third format-compatible contact further comprises at least one bump-solder connector, comprising said at least one solder, configured to assist bump-solder electrical coupling of said at least one third format-compatible contact to such at least one electrical contact of such at least one electronic substrate.

8. A method relating to interfacing a set of proprietary microelectronic devices to at least one electrical contact pattern of at least one electronic substrate, wherein each proprietary microelectronic device of such set comprises a proprietary electrical contact pattern distinct from the other members of such set, said system comprising the steps of:

a) providing at least one microelectronic interfacer structured and arranged to electrically interface such set of proprietary microelectronic devices to such at least one electrical contact pattern of such at least one electronic substrate;

b) providing within such at least one microelectronic interfacer i) at least one first-format-compatible contact configured to implement, within such at least one microelectronic interfacer, at least one first format-compatible electrical contact configured to assist electrical coupling with at least one first proprietary microelectronic device of such set, ii) at least one second-format-compatible contact configured to implement, within such at least one microelectronic interface, at least one second-format-compatible electrical contact configured to assist electrical coupling with at least one second proprietary microelectronic device of such set, iii) at least one third-format-compatible contact configured to implement, within such at least one microelectronic interface, at least one third-format-compatible electrical contact configured to assist electrical coupling with such at least one electrical contact pattern of such at least one electronic substrate, iv) at least one redistributing coupler configured to redistribute coupling of such at least one first formatted contact and such at least one second formatted contact with such at least one third formatted contact, and v) solder-based electrical coupler means for assisting at least one solder-based electrical-coupling of said third-format-compatible contact means to at least one electrical contact of such at least one electronic substrate, wherein such solder-based electrical coupler means comprises at least one solder having at least one minimum flow temp;

c) configuring such first-format-compatible contact means and such second-format-compatible contact means to comprise non-solder electrical coupler means for assisting low-temperature electrical coupling of at least one of such set of proprietary microelectronic devices to at least one of such first-format-compatible contact means and such second-format-compatible contact means, wherein such low-temperature electrical coupling assisted by said non-solder electrical coupler means occurs at a temperature below such at least one minimum flow temp of such at least one solder.

9. The method, according to claim 8, further comprising the step of providing within such at least one microelectronic interface, at least one electrical isolator structured and arranged to electrically isolate portions of such at least one microelectronic interfacer from at last one of such at least one first proprietary microelectronic device and such at least one second proprietary microelectronic device when at least a selected one of such at least one first proprietary microelectronic device and such at least one second proprietary microelectronic device is electrically coupled to such at least one microelectronic interfacer.

10. The method, according to claim 9, further comprising the step of forming within such at least one third format-compatible contact at least one bump-solder connector, using such at least one solder, configured to assist bump-solder electrical coupling of such at least one third format-compatible contact to of such at least one electrical contact of such at least one electronic substrate.

11. The method, according to claim 10, further comprising the step of coupling at least a selected one of such at least one first proprietary microelectronic device and such at least one second proprietary microelectronic device to such at least one microelectronic interface using at least one die-attach film.

12. The method, according to claim 11, further comprising the step of coupling at least a selected one of such at least one first proprietary microelectronic device and such at least one second proprietary microelectronic device to such at least one microelectronic interface using at least one anisotropic conductive film.

13. The method, according to claim 12, further comprising the step of coupling at least a selected one of such at least one first proprietary microelectronic device and such at least one second proprietary microelectronic device to such at least one microelectronic interface using at least one conductive polymer paste.

14. The method, according to claim 13, wherein said at least one conductive polymer paste comprises essentially at least one photo-sensitive-curable material.

15. A microelectronic interface system relating to interfacing a set of proprietary microelectronic devices to at least one electrical contact pattern of at least one electronic substrate, wherein each proprietary microelectronic device of such set comprises a proprietary electrical contact pattern distinct from the other members of such set, said system comprising:
a) microelectronic interfacer means for electrically interfacing such set of proprietary microelectronic devices to such at least one electrical contact pattern of such at least one electronic substrate;
b) wherein said microelectronic interfacer means comprises
  i) first-format-compatible contact means for implementing, within said microelectronic interfacer means, at least one first-format-compatible electrical contact configured to assist electrical coupling with at least one first proprietary microelectronic device of such set,
  ii) second-format-compatible contact means for implementing within said microelectronic interfacer means at least one second-format-compatible electrical contact configured to assist electrical coupling with at least one second proprietary microelectronic device of such set,
  iii) third-format-compatible contact means for implementing within said microelectronic interfacer means at least one third-format-compatible electrical contact configured to assist electrical coupling with such at least one electrical contact pattern of such at least one electronic substrate, and
  iv) redistributing coupler means for redistributed coupling of said first-format-compatible contact means and said second formatted contact means with said third-format-compatible contact means;
c) wherein said third-format-compatible contact means comprises solder-based electrical coupler means for assisting at least one solder-based electrical-coupling of said third-format-compatible contact means to at least one electrical contact of such at least one electronic substrate;
d) wherein said solder-based electrical coupler means comprises at least one solder having at least one minimum flow temp;
e) wherein said first-format-compatible contact means and said second-format-compatible contact means comprises non-solder electrical coupler means for assisting low-temperature electrical coupling of at least one of such set of proprietary microelectronic devices to at least one of said first-format-compatible contact means and said second-format-compatible contact means; and
f) wherein such low-temperature electrical coupling assisted by said non-solder electrical coupler means occurs at a temperature below such at least one minimum flow temp of said at least one solder.

16. The microelectronic interface system, according to claim 15, further comprising electrical isolator means for electrically isolating portions of said microelectronic interfacer means from at last one of such at least one first proprietary microelectronic device and such at least one second proprietary microelectronic device when at least a selected one of such at least one first proprietary microelectronic device and such at least one second proprietary microelectronic device is electrically coupled to said microelectronic interfacer means.

17. The microelectronic interface system, according to claim 16, further comprising at least one die-attach film structured and arranged to assist coupling of at least a selected one of such at least one first proprietary microelectronic device and such at least one second proprietary microelectronic device to such at least one microelectronic interface.

18. The microelectronic interface system, according to claim 16, further comprising at least one anisotropic conductive film structured and arranged to assist coupling of at least a selected one of such at least one first proprietary microelectronic device and such at least one second proprietary microelectronic device to such at least one microelectronic interface.

19. The microelectronic interface system, according to claim 16, further comprising at least one conductive polymer paste structured and arranged to assist coupling of at least a selected one of such at least one first proprietary microelectronic device and such at least one second proprietary microelectronic device to such at least one microelectronic interface.

20. The microelectronic interface system, according to claim 19, wherein said at least one conductive polymer paste comprises essentially at least one photo-sensitive-curable material.

21. The microelectronic interface system, according to claim 15, such wherein said third format-compatible contact means further comprises bump-solder connector means for assisting bump-solder electrical coupling of such third format-compatible contact means to such electrical contact means of such at least one electronic substrate.

* * * * *